US011486900B2

(12) United States Patent
Ermolov et al.

(10) Patent No.: US 11,486,900 B2
(45) Date of Patent: Nov. 1, 2022

(54) PROBE APPARATUS

(71) Applicant: TEKNOLOGIAN TUTKIMUSKESKUS VTT OY, Espoo (FI)

(72) Inventors: Vladimir Ermolov, Espoo (FI); Antti Lamminen, Espoo (FI); Jussi Säily, Espoo (FI); Tauno Vähä-Heikkilä, Espoo (FI); Pekka Rantakari, Espoo (FI)

(73) Assignee: TEKNOLOGIAN TUTKIMUSKESKUS VTT OY, Espoo (FI)

( * ) Notice: Subject to any disclaimer, the term of this patent is extended or adjusted under 35 U.S.C. 154(b) by 420 days.

(21) Appl. No.: 16/615,239

(22) PCT Filed: May 22, 2018

(86) PCT No.: PCT/FI2018/050385
§ 371 (c)(1),
(2) Date: Nov. 20, 2019

(87) PCT Pub. No.: WO2018/215694
PCT Pub. Date: Nov. 29, 2018

(65) Prior Publication Data
US 2020/0158757 A1    May 21, 2020

(30) Foreign Application Priority Data
May 23, 2017  (FI) ..................................... 20175463

(51) Int. Cl.
*G01R 1/24* (2006.01)
*G01R 1/067* (2006.01)
(Continued)

(52) U.S. Cl.
CPC ........... *G01R 1/24* (2013.01); *G01R 1/06772* (2013.01); *G01R 21/01* (2013.01); *H01P 5/107* (2013.01); *H01P 5/12* (2013.01)

(58) Field of Classification Search
CPC ...... G01R 1/24; G01R 1/06772; G01R 21/01; H01P 5/107; H01P 5/12
See application file for complete search history.

(56) References Cited

U.S. PATENT DOCUMENTS 6,870,438 B1    3/2005  Shino et al.
6,956,448 B1 *  10/2005  Willems .................. H01P 5/187
                                                      333/33

(Continued)

FOREIGN PATENT DOCUMENTS

CN    103280619 A    9/2013
CN    104579176 A    4/2015

(Continued)

OTHER PUBLICATIONS

Lamminen et al., "Wideband stacked patch antenna array on LTCC for W-band." In: The 5th European Conference on Antennas and Propagation (EUCAP), IEEE, Apr. 11, 2011, pp. 2962-2966.

(Continued)

*Primary Examiner* — Stephen E. Jones
(74) *Attorney, Agent, or Firm* — Nixon & Vanderhye PC

(57) ABSTRACT

A probe apparatus of a millimeter or submillimeter radio frequency band comprises transition layers having outermost layers on opposite surfaces of the probe apparatus. An internal transition cavity extends through the transition layers for guiding electromagnetic radiation within the probe apparatus. A probe layer disposed between the transition layers, the probe layer having a lateral transmission line for interacting with the electromagnetic radiation guided by the internal transmission cavity.

13 Claims, 2 Drawing Sheets

Figure 1:
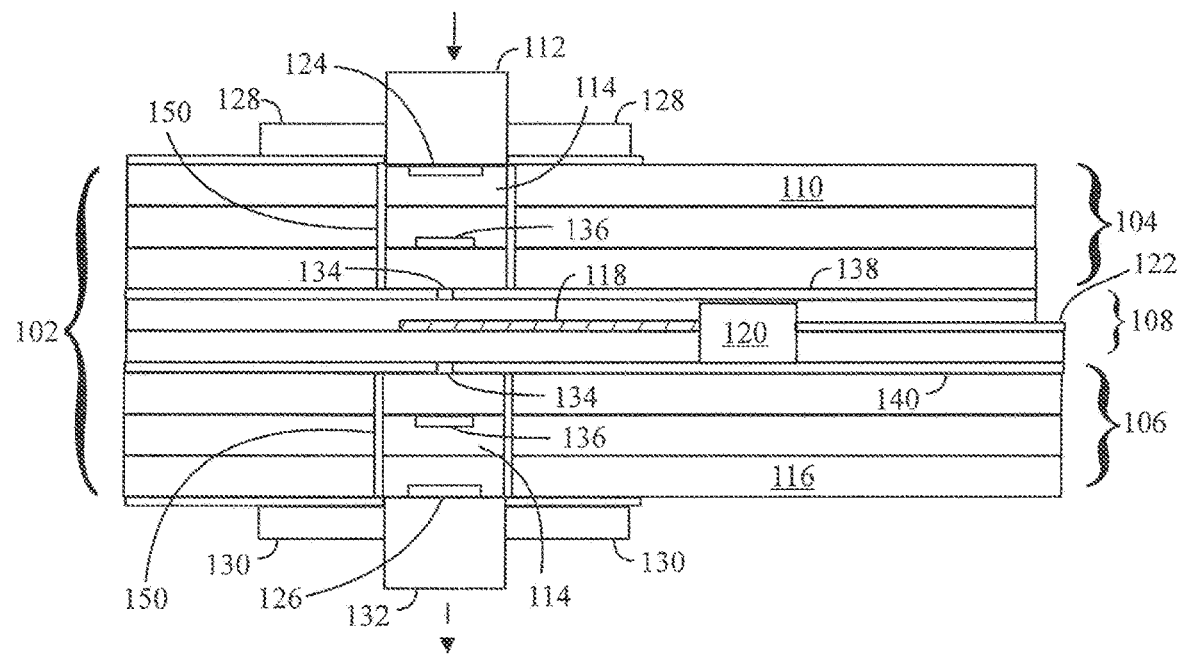

(51) Int. Cl.
*G01R 21/01* (2006.01)
*H01P 5/107* (2006.01)
*H01P 5/12* (2006.01)

(56) References Cited

U.S. PATENT DOCUMENTS

| | | | |
|---|---|---|---|
| 8,390,403 | B1 | 3/2013 | Schaffner et al. |
| 2008/0252298 | A1 | 10/2008 | Noujeim |
| 2012/0293163 | A1 | 11/2012 | Sasson |
| 2018/0026324 | A1* | 1/2018 | Miller .................. H01P 11/003 333/137 |

FOREIGN PATENT DOCUMENTS

| | | |
|---|---|---|
| CN | 105980867 A | 9/2016 |
| EP | 0 209 962 | 1/1987 |
| EP | 0 527 617 | 12/1993 |
| EP | 3 026 441 | 6/2016 |
| JP | H08-101236 | 4/1996 |
| JP | 2013-167600 | 8/2013 |
| JP | 2016-178571 | 10/2016 |
| WO | 2016/094129 | 6/2016 |

OTHER PUBLICATIONS

International Search Report for PCT/FI2018/050385 dated Sep. 5, 2018, 2 pages.
Written Opinion of the ISA for PCT/FI2018/050385 dated Sep. 5, 2018, 5 pages.
Search Report for FI20175463 dated Dec. 13, 2017, 2 pages.
Office Action dated Apr. 20, 2022 in corresponding Japanese Application No. 2019-564521 (with translation); 6 pages.
Chinese Office Action dated Jul. 5, 2021 for CN Application No. 2018800483959 (with partial English translation), 8 pages.

* cited by examiner

PROBE APPARATUS

This application is the U.S. national phase of International Application No. PCT/FI2018/050385 filed May 22, 2018 which designated the U.S. and claims priority to FI Patent Application No. 20175463 filed May 23, 2017, the entire contents of each of which are hereby incorporated by reference.

FIELD

The invention relates to a probe apparatus.

BACKGROUND

A measurement and control of power or other property of the electromagnetic radiation of radio frequency band which can propagate in a waveguide is vital for testing, maintenance and keeping a device or system within regulations. Here the radio frequency band may refer to millimeter or sub-millimeter wavelengths excluding wavelengths equal to or shorter than optical radiation.

Existing meters are terminating units which means that the system has to be reassembled for measuring power. The measurement may, thus, be performed using the meter by opening a joint in the original propagating path (i.e. in a waveguide, for example) of the radio frequency signal system and connecting the probe to the joint, which cuts the normal operation of the system. After the measurement, the probe can be removed and the normal operation of the radio frequency system may be restored.

A power sensor of the probe may be based on zero-biased detector (ZBD) with a low barrier Schottky diode. The meter is a terminating unit which is also bulky and expensive. Hence, there is a need to improve the measurements.

BRIEF DESCRIPTION

The present invention seeks to provide an improvement in the measurements of millimeter or sub-millimeter wavelengths of electromagnetic radiation. According to an aspect of the present invention, there is provided a probe apparatus as specified in the independent claim.

The invention has advantages. The probe apparatus may be made small in size. The probe apparatus enables a normal operation of the system while connected which, in turn, allows measurements in real time. The probe apparatus is also of low cost.

LIST OF DRAWINGS

Figure 2:
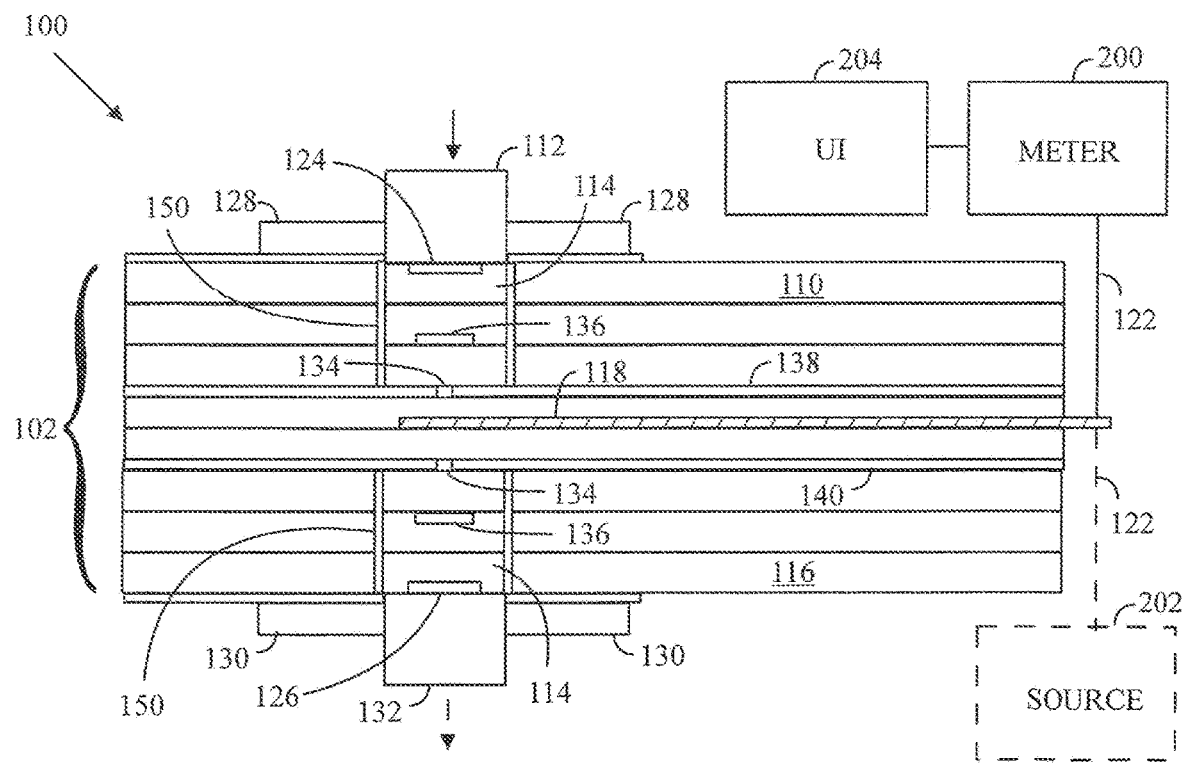
Figure 3:
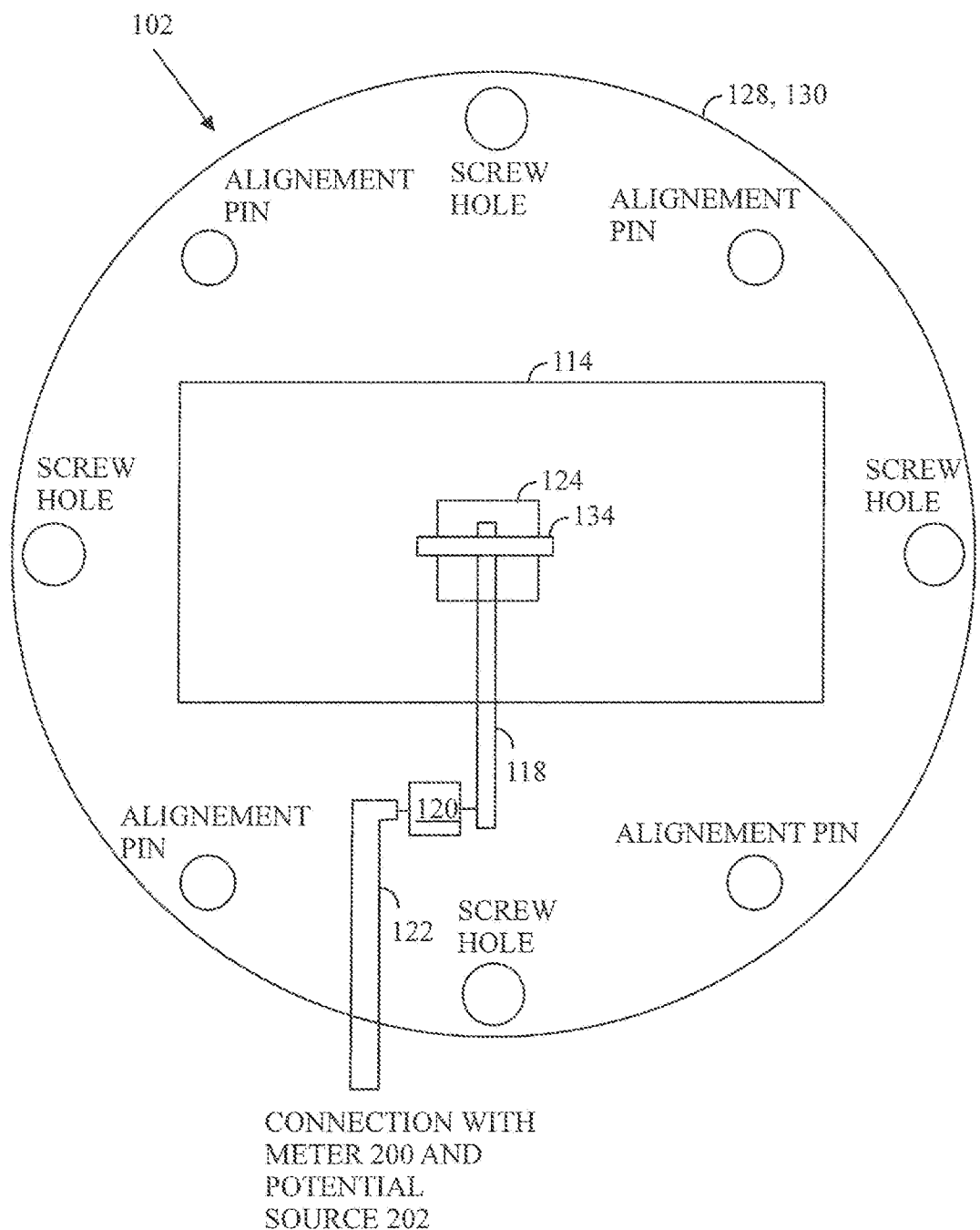

Example embodiments of the present invention are described below, by way of example only, with reference to the accompanying drawings, in which FIGS. 1 to 3 illustrate examples of the probe apparatus.

DESCRIPTION OF EMBODIMENTS

The following embodiments are only examples. Although the specification may refer to "an" embodiment in several locations, this does not necessarily mean that each such reference is to the same embodiment(s), or that the feature only applies to a single embodiment. Single features of different embodiments may also be combined to provide other embodiments. Furthermore, words "comprising" and "including" should be understood as not limiting the described embodiments to consist of only those features that have been mentioned and such embodiments may contain also features/structures that have not been specifically mentioned.

It should be noted that while Figures illustrate various embodiments, they are simplified diagrams that only show some structures and/or functional entities. The connections shown in the Figures may refer to logical or physical connections. It is apparent to a person skilled in the art that the described apparatus may also comprise other functions and structures than those described in Figures and text. It should be appreciated that details of some functions, structures, and the signalling used for measurement and/or controlling are irrelevant to the actual invention. Therefore, they need not be discussed in more detail here.

FIG. 1 illustrates an example of a probe apparatus 100 of a radio frequency band. The radio frequency band may be in a millimeter or sub-millimeter range. The radio frequency band may include electromagnetic radiation which has lower frequency than optical radiation and which is capable of travelling in vacuum or in the air. Thus, the radio frequency band may refer to millimeter or sub-millimeter wavelengths excluding wavelengths equal to or shorter than optical radiation.

The probe apparatus 100 comprises a layered structure 102 which comprises transition layers 104, 106 and at least one probe layer 108 therebetween. The transition layers 104, 106 and the probe layer 108 may comprise low temperature co-fired ceramics (LTCC), printed circuit board (PCB) or the like, for example. The transition layers 104, 106, 110 (first outer layer), 116 (second outer layer) and the probe layer 108 may be glued or soldered together. The first outer layer 110 and second outer layer 116 may also be called outermost layers 110, 116, and they are on opposite surfaces of the probe apparatus 100.

Alternatively or additionally, the layers 104, 106, 108, 110, 116 may be attached to each other using at least one screw or rivet, for example. Any layer 104, 106, 108, 110, 116 may be a plate-like structure having a constant thickness. In an embodiment, all layers 104, 106, 108, 110, 116 may have the same thickness. In an embodiment, transition layers 104, 106 may have a different thickness from the probe layer 108.

The first outer layer 110 of the transition layers 104, 106 is connectable with a first outer waveguide 112 for receiving electromagnetic radiation from an outside radio frequency source (see arrow headed line; the outside radio frequency source is not shown in Figures).

An internal transition cavity 114 extending through the transition layers 104, 106 guides the electromagnetic radiation within the probe apparatus 100. The internal transition cavity 114 may guide the electromagnetic radiation from the first outer waveguide 112 through the layered structure 102. The internal transition cavity 114 may guide the electromagnetic radiation between the outer waveguides 112, 132. The transition cavity 114 has electrically conductive walls 150 which contain material of the transition layers 104, 106. A first transition in the internal transition cavity 114 carries the electromagnetic radiation above a lateral transition line 118 from the first outer waveguide 112 to the probe layer 108. The electrically conductive walls 150 may be made of metal, for example.

The electrically conductive walls 150 of transition layers 104, 106 attached to and facing each other may have a galvanic contact with each other for having a materially continuous transition cavity. The walls 150 are vias through the transition layers 104, 106. The internal transition cavity 114 is a straight tube-like structure, a central line of which is parallel with respect to a normal of the layers 104, 106, 108, 110, 116. The cross section of the tube of the transition cavity 114 may be arbitrary. The cross section of the tube may be a circle, an ellipse, a polygon, a rectangular or a square, for example. The internal transition cavity 114 performs like a waveguide, and it may be considered as a short waveguide. The electromagnetic radiation within the layered structure 102 is guided by the internal transmission cavity 114.

A probe layer 108 is disposed between the transition layers 104 and 106. In other words, the probe layer 108 is located between first outer layer 110 and a second outer layer 116 of the transition layers 104, 106. The probe layer 108 has a lateral transmission line 118 for interacting with the electromagnetic radiation within the layered structure 102. The lateral transmission line 118 may comprise a strip line, for example. That the transmission line 118 is lateral means that a longitudinal axis of the transmission line 118 is at least approximately parallel with longitudinal axes of the layers 104, 106, 108, 110, 116. Thus, the longitudinal axis of the transmission line 118 is perpendicular with respect to a central axis of the internal transition cavity 114.

In an embodiment illustrated in FIG. 1, the lateral transmission line 118 of the probe layer 108 may allow an output of at least a part of the electromagnetic radiation from internal transmission cavity 114 in the layered structure 102. The part or the sample of the electromagnetic radiation taken to the lateral transmission line 118 may be known or predefined such that the part or the sample represents the electromagnetic radiation within the layered structure 102 in a known and determined manner.

In an embodiment illustrated in FIG. 1, the lateral transmission line 118 may be connected with a rectifying component 120 which rectifies the at least a part of the electromagnetic radiation received with the transmission line 118 into a DC-signal. In an embodiment, the rectifying component 120 is inside the layered structure 102, and rectifying component 120 has a conductor 122 extending out of the layered structure 102 for outside connection. The outside connection may refer to a connection with a meter 200 (see FIG. 2). In an embodiment, the rectifying component 120 is inside the probe layer 108 and the conductor 122 is at least partly inside the probe layer 108. In an embodiment, the conductor 122 may be printed on the probe layer 108, and the transition layers 104, 106 may have a different lateral length in a longitudinal direction of the conductor 122 for leaving a part of the layered structure 102 open (cavity) to provide space for an external connection. In an embodiment, the conductor 122 may be partly outside the probe layer 108.

In an embodiment illustrated in FIG. 2, the conductor 122 may be fully outside the layered structure 102 and directly connected with the lateral transmission line 118. In an embodiment illustrated in FIG. 2, the rectifying component 120 may be associated with the meter 200. In an embodiment, the rectifying component 120 may comprise a diode. In an embodiment, the diode may be a planar doped barrier diode. In an embodiment, the diode may be a Schottky diode. In an embodiment, the diode may be a low barrier Schottky diode.

FIG. 2 illustrates an example of an embodiment, where the probe apparatus comprises the meter 200 which has a direct or indirect connection with the transmission line 118. The meter 200 may be a power meter for measuring a power of the electromagnetic radiation within the layered structure 102. Irrespective whether a rectifying component 120 is inside or outside the layered structure 102, the power meter 200 may measure the DC-signal rectified by the rectifying component 120 through the conductor 122. Alternatively or additionally, the meter 200 may measure phase, polarization and/or frequency of the electromagnetic radiation on the basis of the sample signal conveyed by the transmission line 118. In an embodiment, the power meter may comprise or act as an envelope detector.

In an embodiment illustrated in FIGS. 1 and 2, the lateral transmission line 118 of the probe layer 108 may allow a signal input to the internal transmission cavity 114 of the layered structure 102 for causing a change in a property of the electromagnetic radiation therein. The property may be at least one of the following: polarization, phase shift and power. FIG. 2 illustrates an example of an embodiment, where the signal input to the lateral transmission line 118 is performed using an outside signal source 202.

The layered structure 102 may be used by different ways. For example, there are at least the following three ways:

1. A small part of energy may be taken from a waveguide and measure it with a diode for example, i.e. a power meter mode 2. A small part of energy may be taken from a waveguide and use it for signal processing in some application, i.e. a signal processing mode 3. A micro stripe line may be loaded with for example a tunable passive circuit and influence on signal inside waveguide, i.e. a phase shifter mode.

In an embodiment illustrated in FIGS. 1 and 2, the first outer layer 110 may comprise a first transition element 124, which is operationally connectable with the first outer waveguide 112, for conveying the electromagnetic radiation in to the internal transition cavity 114. The first transition element 124 may be a patch, the dimensions of which are in resonance with the electromagnetic radiation coupled to it from the first outer waveguide 112. The second outer layer 116 may comprise a second transition element 126 which interacts with the electromagnetic radiation guided through the internal transition cavity 114 for further conveyance of the electromagnetic radiation from the internal transition cavity 114. The second transition element 126 may also be a patch, the dimensions of which are in resonance with the electromagnetic radiation coupled to it in the internal transition cavity 114. As the internal transition cavity 114 is a straight tube-like structure, a central line of which is parallel with respect to a normal of the layers 104, 106, 108, 110, 116, the first transition element 124 and second transition element 126 may be face to face to each other. As a result, the electromagnetic radiation may propagate through the layered structure 102 between the first and second resonant transition elements 124, 126 via the coupling apertures 134. The transition elements 124, 126 may be considered driven elements. The first and second transition elements 124, 126 may be made of electrically conductive material. The first and second transition elements 124, 126 may be made of metal, for example.

In an embodiment illustrated in FIGS. 1 and 2, the layered structure 102 comprises connectors 128, 130 associated with the first and second outer layers 110, 116. The outermost layers 110, 116 are connectable to outer waveguides 112, (132). A first connector 128 of the connectors may be connectable with the first outer waveguide 112 for conveying the electromagnetic radiation from the first waveguide 112 in to the internal transition cavity 114. A second connector 130 of the connectors may be connectable with an end terminal or a second outer waveguide 132 for receiving the electromagnetic radiation from the internal transition cavity 114. In fact, the connectors 128 and 130 may have waveguide flanges that are included in the waveguide structure (112, 132). The waveguide 112 with the connector 128 may be called an external input waveguide and the waveguide 132 with the connector 130 maybe called an external output waveguide.

Hence, another transition in the internal transition cavity 114 mirrors the electromagnetic radiation underneath the lateral transition line 118 from the probe layer 108 towards the second outer waveguide or terminal end 132. The connectors 128, 130 may comprise flanges (of the waveguides). The end terminal may act as a matched termination to the electromagnetic radiation. The second outer waveguide (132) may allow the propagation of the electromagnetic radiation from the internal transition cavity 114 to a desired target (see dashed arrow in FIGS. 1 and 2).

In another embodiment, the end terminal (132) may be implemented within the layered structure 102 by having only the second outer layer 116 against the probe layer 108. Then no coupling aperture 134 is needed between the probe layer 108 and the second outer layer 116. The input signal may then go through the transmission line 118 into some termination such as matched load.

As the internal transition cavity 114 is a straight tube-like structure, a central line of which is parallel with respect to a normal of the layers 104, 106, 108, 110, 116, the first waveguide 112 and the second waveguide may be face to face to each other. In a similar manner, the first waveguide 112 and the end terminal may be face to face to each other.

In an embodiment illustrated in FIGS. 1 and 2, the second transition element 126 is operationally connectable with the second outer waveguide or the end terminal 132 for feeding the electromagnetic radiation from the inner transition cavity 114 to either of the second outer waveguide or the end terminal, respectively.

In an embodiment, on both sides of the probe layer 110 the internal transition cavity 114 may have coupling apertures 134 for the electromagnetic radiation. The coupling apertures 134 are used for impedance matching between the transition and the transmission line 118 and for controlling the amount of coupling between transitions and transmission line(s).

In an embodiment, a degree of the interaction between the lateral transmission line 118 and the electromagnetic radiation within the probe layer 108 may be adjustable with a design of the coupling apertures 134. In this manner, the lateral transmission line 118 may take a certain percentage as a sample from the electromagnetic radiation which is inside the probe layer 108. The percentage may be 0.1%, 1%, 10% or 15%, for example. When 1% of the electromagnetic radiation is taken to the lateral transmission line 118, the meter 200 may measure it and present a value which is about one hundred times higher than the measured power on a screen of or in a printed form using an user interface 204 of the meter 200 in order to indicate the power of the electromagnetic radiation inside the probe apparatus 100. In general, the signal in the lateral transmission line 118 is deterministically proportional to the electromagnetic radiation in the probe layer 108. And a value of the signal detected from the lateral transmission line 118 is proportional to a value of the measured property of the electromagnetic radiation in the probe layer 108.

In an embodiment illustrated in FIGS. 1 and 2, the internal transition cavity 114 comprises at least one parasitic transition element 136 associated with the transition layers 104, 106 for increasing the transitional bandwidth of the electromagnetic radiation through the layered structure 102. The at least one parasitic transition element 136 may be used for generating multiple resonances in within the layered structure 102. The at least one parasitic transition element 136 may be similar to transition elements 124, 126. If there is one parasitic transition element 136 in transitional layers 104, the transition element 136 may be in any layer between the first outer layer 110 and the probe layer 108. If there is one parasitic transition element 136 in transitional layers 106, the transition element 136 may be in any layer between the probe layer 108 and the second outer layer 116. The wider the bandwidth is desired to be, the more parasitic elements there may be.

In an embodiment illustrated in FIGS. 1 and 2, the probe layer 108 may be between electrically conducting layers 138, 140 which have the coupling apertures 134.

In an embodiment illustrated in FIGS. 1 and 2, the electrically conducting walls 150 may be connected in a galvanic manner with the coupling apertures 134.

In an embodiment illustrated in FIGS. 1 and 2, the electrically conducting walls 150 may be connected in a galvanic manner with the electrically conducting layers 138, 140.

FIG. 3 illustrates an example of the layered structure 102 from above while having flanges 128, 130 the same size or larger than the layers 104, 106, 108. In this example, the rectifying component 120 is outside the layered structure 102 but still between the flanges 128, 130. The edges of the layered structure 102 have not been drawn here. The substrate extends to the connection with meter 200. In this example the screw holes and/or alignment pins go through the layered structure 102 so that the substrate may be assembled between the input and output waveguides. Then the screws and pins could be mounted through the substrate 102.

The probe apparatus 100 and the layered structure 102 may be applied in radio frequency transmitters and base stations of a radio system, for example. The layered structure 102 may be connected after a power amplifier or at an antenna port in a transmitter. The probe apparatus 100 and the layered structure 102 may be utilized in testing measurements for controlling whether a transmitter fulfils the power regulations. The layered structure 102 may be integrated in the radio frequency system for allowing the measurement of power in continues mode. Naturally, the power may also be measured in a discrete or non-continuous manner. In general, the layered structure 102 may be integrated in the radio frequency system for allowing the interaction with the electromagnetic radiation in continues mode. Naturally, the interaction may also be performed in a discrete or non-continuous manner.

It will be obvious to a person skilled in the art that, as technology advances, the inventive concept can be implemented in various ways. The invention and its embodiments are not limited to the example embodiments described above but may vary within the scope of the claims.

The invention claimed is:

1. A probe apparatus of a millimeter or submillimeter radio frequency band, the probe apparatus having a layered structure and comprising:

transition layers having outermost layers on opposite surfaces of the probe apparatus, at least one of the outermost layers being connectable to an outer waveguide;

an internal transition cavity extending through the transition layers for guiding electromagnetic radiation within the probe apparatus; and a probe layer disposed between the transition layers, the probe layer having a lateral transmission line for interacting with the electromagnetic radiation guided by the internal transmission cavity.

2. The apparatus of claim 1, wherein the internal transition cavity comprises at least two parasitic transition elements associated with the transition layers for increasing the transitional bandwidth of the electromagnetic radiation through the layered structure.

3. The apparatus of claim 1, wherein the first outer layer of the outermost layers comprises a first transition element, which is operationally connectable with a first outer waveguide of a plurality of outer waveguides, for conveying the electromagnetic radiation in to the internal transition cavity, and the second outer layer of the outermost layers comprises a second transition element configured to interact with the electromagnetic radiation guided through the internal transition cavity for further conveyance of the electromagnetic radiation from the internal transition cavity.

4. The apparatus of claim 3, wherein the layered structure comprises connectors associated with the first and second outer layers of the outermost layers, a first connector of the connectors being connectable with the first outer waveguide of the plurality of outer waveguides for conveying the electromagnetic radiation from the first waveguide in to the internal transition cavity, and a second connector of the connectors being connectable with an end terminal or a second outer waveguide of the plurality of outer waveguides for receiving the electromagnetic radiation from the internal transition cavity.

5. The apparatus of claim 4, wherein the second transition element is operationally connectable with the second outer waveguide or the end terminal for feeding the electromagnetic radiation to either of them, respectively.

6. The apparatus of claim 1, wherein on both sides of the probe layer the internal transition cavity has a coupling apertures for the electromagnetic radiation.

7. The apparatus of claim 6, wherein a degree of the interaction between the lateral transmission line and the electromagnetic radiation within the probe layer is configured to be adjustable with a design of the coupling apertures.

8. The apparatus of claim 1, wherein the lateral transmission line of the probe layer is configured to allow an output of at least a part of the electromagnetic radiation from the internal transmission cavity and/or a signal input to the internal transmission cavity for causing a change in a property of the electromagnetic radiation.

9. The apparatus of claim 8, wherein the first outer layer of the outermost layers comprises a first transition element, which is operationally connectable with a first outer waveguide of a plurality of outer waveguides, for conveying the electromagnetic radiation in to the internal transition cavity, and the second outer layer of the outermost layers comprises a second transition element configured to interact with the electromagnetic radiation guided through the internal transition cavity for further conveyance of the electromagnetic radiation from the internal transition cavity.

10. The apparatus of claim 8, wherein the probe apparatus comprises a power meter having a connection with the lateral transmission line and configured to measure a power of the electromagnetic radiation.

11. The apparatus of claim 10, wherein the first outer layer of the outermost layers comprises a first transition element, which is operationally connectable with a first outer waveguide of a plurality of outer waveguides, for conveying the electromagnetic radiation in to the internal transition cavity, and the second outer layer of the outermost layers comprises a second transition element configured to interact with the electromagnetic radiation guided through the internal transition cavity for further conveyance of the electromagnetic radiation from the internal transition cavity.

12. The apparatus of claim 10, wherein the lateral transmission line is connected with a rectifying component configured to rectify the output of the at least a part of the electromagnetic radiation received with the transmission line into a DC-signal, and the power meter is configured to measure the DC-signal.

13. The apparatus of claim 12, wherein the first outer layer of the outermost layers comprises a first transition element, which is operationally connectable with a first outer waveguide of a plurality of outer waveguides, for conveying the electromagnetic radiation in to the internal transition cavity, and the second outer layer of the outermost layers comprises a second transition element configured to interact with the electromagnetic radiation guided through the internal transition cavity for further conveyance of the electromagnetic radiation from the internal transition cavity.

* * * * *